United States Patent
Bellman et al.

(10) Patent No.: US 11,764,117 B2
(45) Date of Patent: Sep. 19, 2023

(54) HERMETICALLY SEALED OPTICALLY TRANSPARENT WAFER-LEVEL PACKAGES AND METHODS FOR MAKING THE SAME

(71) Applicant: CORNING INCORPORATED, Corning, NY (US)

(72) Inventors: Robert Alan Bellman, Ithaca, NY (US); Jin Su Kim, Seoul (KR)

(73) Assignee: CORNING INCORPORATED, Corning, NY (US)

( * ) Notice: Subject to any disclaimer, the term of this patent is extended or adjusted under 35 U.S.C. 154(b) by 208 days.

(21) Appl. No.: 17/043,561

(22) PCT Filed: Apr. 2, 2019

(86) PCT No.: PCT/US2019/025445
§ 371 (c)(1),
(2) Date: Sep. 29, 2020

(87) PCT Pub. No.: WO2019/195334
PCT Pub. Date: Oct. 10, 2019

(65) Prior Publication Data
US 2021/0028077 A1 Jan. 28, 2021

Related U.S. Application Data

(60) Provisional application No. 62/652,277, filed on Apr. 3, 2018.

(51) Int. Cl.
*H01L 23/053* (2006.01)
*B32B 3/30* (2006.01)
(Continued)

(52) U.S. Cl.
CPC .............. *H01L 23/053* (2013.01); *B32B 3/30* (2013.01); *B32B 17/06* (2013.01); *B81B 7/0038* (2013.01);
(Continued)

(58) Field of Classification Search
CPC ....... H01L 23/041; H01L 21/52; H01L 23/26; H01L 27/14618; H01L 27/14683;
(Continued)

(56) References Cited

U.S. PATENT DOCUMENTS 4,130,680 A  12/1978 Ference et al.
6,452,238 B1  9/2002 Orcutt et al.
(Continued)

FOREIGN PATENT DOCUMENTS

GB  2315266 A  1/1998
JP  2000-178036 A  6/2000
WO  2019/023213 A1  1/2019

OTHER PUBLICATIONS

Buch et al; "Design and Demonstration of Highly Miniaturized Low Cost Panel Level Glass Package for MEMS Sensors"; 2017 IEEE 67th Electronic Components and Technology Conference; 10 Pages.
(Continued)

*Primary Examiner* — Eduardo A Rodela
(74) *Attorney, Agent, or Firm* — Daniel J. Greenhalgh

(57) ABSTRACT

Wafer level encapsulated packages includes a wafer, a glass substrate hermetically sealed to the wafer, and an electronic component. The glass substrate includes a glass cladding layer fused to a glass core layer and a cavity formed in the glass substrate. The electronic component is encapsulated within the cavity. In various embodiments, the floor of the cavity is planar and substantially parallel to a plane defined by a top surface of the glass cladding layer. The glass cladding layer has a higher etch rate in an etchant than the glass core layer. In various embodiments, the wafer level encapsulated package is substantially optically transparent. Methods for forming the wafer level encapsulated package and electronic devices formed from the wafer level encapsulated package are also described.

23 Claims, 5 Drawing Sheets

(51) Int. Cl.
| | |
|---|---|
| *B32B 17/06* | (2006.01) |
| *B81B 7/00* | (2006.01) |
| *B81C 1/00* | (2006.01) |
| *C03C 15/00* | (2006.01) |
| *H01L 21/52* | (2006.01) |
| *H01L 23/04* | (2006.01) |
| *H01L 23/26* | (2006.01) |
| *H01L 27/146* | (2006.01) |
| *H01L 31/0203* | (2014.01) |
| *H01L 31/18* | (2006.01) |
| *H01L 33/48* | (2010.01) |
| *H01L 23/10* | (2006.01) |
| *H01L 23/08* | (2006.01) |

(52) U.S. Cl.
CPC ........ *B81B 7/0067* (2013.01); *B81C 1/00317* (2013.01); *C03C 15/00* (2013.01); *H01L 21/52* (2013.01); *H01L 23/041* (2013.01); *H01L 23/08* (2013.01); *H01L 23/10* (2013.01); *H01L 23/26* (2013.01); *H01L 27/14618* (2013.01); *H01L 27/14683* (2013.01); *H01L 31/0203* (2013.01); *H01L 31/18* (2013.01); *H01L 33/483* (2013.01); *B32B 2315/08* (2013.01); *B32B 2457/14* (2013.01); *B81C 2203/0109* (2013.01); *H01L 2933/0033* (2013.01)

(58) Field of Classification Search
CPC ... H01L 31/0203; H01L 31/18; H01L 33/483; H01L 2933/0033; H01L 21/48; H01L 21/4817; H01L 23/02; H01L 23/04; H01L 23/043; H01L 23/053; H01L 23/06; H01L 23/08; H01L 23/10; H01L 23/147; H01L 23/15; H01L 25/10; H01L 25/115; H01L 27/1462; H01L 27/14623; H01L 27/14625; H01L 33/48; B32B 3/30; B32B 17/06; B32B 2315/08; B32B 2457/14; B81B 7/0038; B81B 7/0067; B81B 7/0032; B81C 1/00317; B81C 2203/0109; B81C 1/00261; B81C 1/00269; B81C 1/00277; B81C 1/00285; B81C 1/00293; C03C 15/00

See application file for complete search history.

(56) References Cited

U.S. PATENT DOCUMENTS

| | | | |
|---|---|---|---|
| 6,465,281 B1 | 10/2002 | Xu et al. | |
| 6,713,827 B2 | 3/2004 | Cohen et al. | |
| 6,900,509 B2 * | 5/2005 | Gallup | G02B 6/4204 |
| | | | 257/21 |
| 7,138,293 B2 | 11/2006 | Ouellet et al. | |
| 7,445,119 B2 | 11/2008 | Kampf et al. | |
| 7,528,000 B2 | 5/2009 | Tsai | |
| 7,764,514 B2 | 7/2010 | Mongia et al. | |
| 8,216,884 B2 * | 7/2012 | Higashi | B81B 7/007 |
| | | | 438/51 |
| 9,236,355 B2 | 1/2016 | Zhai et al. | |
| 9,340,451 B2 * | 5/2016 | Boek | G03F 7/0757 |
| 9,391,041 B2 | 7/2016 | Lin | |
| 9,397,151 B1 * | 7/2016 | Astrof | H01F 27/00 |
| 9,711,465 B2 | 7/2017 | Liao et al. | |
| 9,716,193 B2 | 7/2017 | Sengupta | |
| 2003/0116825 A1 * | 6/2003 | Geefay | B81B 7/0077 |
| | | | 257/E23.193 |
| 2004/0061207 A1 | 4/2004 | Ding | |
| 2004/0207074 A1 * | 10/2004 | MacDonald | C23F 4/00 |
| | | | 257/708 |
| 2006/0163462 A1 | 7/2006 | Eslamy | |
| 2008/0083980 A1 | 4/2008 | Yang et al. | |
| 2008/0310114 A1 | 12/2008 | Pawlenko et al. | |
| 2009/0057868 A1 * | 3/2009 | Wang | H01L 23/10 |
| | | | 257/E23.181 |
| 2009/0091888 A1 | 4/2009 | Lin et al. | |
| 2009/0179317 A1 * | 7/2009 | Iida | H01L 24/96 |
| | | | 257/E21.705 |
| 2009/0238516 A1 | 9/2009 | Bchir et al. | |
| 2010/0065726 A1 | 3/2010 | Zhong et al. | |
| 2011/0195360 A1 * | 8/2011 | Flemming | G03F 7/0043 |
| | | | 430/323 |
| 2011/0207257 A1 * | 8/2011 | Watanabe | H01L 27/14618 |
| | | | 438/66 |
| 2012/0061135 A1 | 3/2012 | Hill et al. | |
| 2012/0142136 A1 | 6/2012 | Horning et al. | |
| 2012/0241209 A1 | 9/2012 | Wu | |
| 2012/0243199 A1 | 9/2012 | Wu | |
| 2012/0248940 A1 * | 10/2012 | Ariji | H03H 9/1035 |
| | | | 156/64 |
| 2012/0285198 A1 | 11/2012 | Shang | |
| 2013/0237034 A1 | 9/2013 | Brockmeier et al. | |
| 2014/0238078 A1 | 8/2014 | Boek et al. | |
| 2015/0015118 A1 * | 1/2015 | Kamijo | H03H 9/1021 |
| | | | 29/25.35 |
| 2015/0085462 A1 | 3/2015 | Okamoto | |
| 2015/0353348 A1 | 12/2015 | Hammond et al. | |
| 2016/0285232 A1 * | 9/2016 | Reinert | H01S 5/4025 |
| 2017/0073266 A1 | 3/2017 | Amosov et al. | |
| 2020/0235020 A1 | 7/2020 | Dohn et al. | |

OTHER PUBLICATIONS

International Search Report and Written Opinion of the International Searching Authority; PCT/US2019/025445; dated Jun. 13, 2019; 9 Pages; Commissioner for Patents.

\* cited by examiner

HERMETICALLY SEALED OPTICALLY TRANSPARENT WAFER-LEVEL PACKAGES AND METHODS FOR MAKING THE SAME

CROSS-REFERENCE TO RELATED APPLICATIONS

This application claims the benefit of priority under 35 U.S.C. § 371 of International Application No. PCT/US2019/025445, filed on Apr. 2, 2019, which claims the benefit of priority under 35 U.S.C. § 119 of U.S. Provisional Application No. 62/652,277, filed Apr. 3, 2018, the content of each of which is incorporated herein by reference in its entirety.

BACKGROUND

Field

This disclosure relates to hermetically sealed optically transparent wafer-level packages and methods for making the same.

Technical Background

Structured glass articles can have cavities or channels that can be useful for a variety of applications, including, by way of example and not limitation, integrated circuit packages, optical encapsulation, and microfluidic devices. Conventional cavity formation produces concave cavities, which may result in optical distortion. Additionally and/or alternatively, conventional packaging formed through polymer molding techniques may present challenges to hermetic sealing.

SUMMARY

Disclosed herein are wafer level encapsulated packages and methods for making the same. Such wafer level encapsulated packages can be used for integrated circuit packages, optical devices, and microfluidic devices.

Disclosed herein is wafer level encapsulated package comprising a wafer, a glass substrate hermetically sealed to the wafer, and an electronic component encapsulated within a cavity of the glass substrate. The glass substrate comprises a glass cladding layer fused to a glass core layer, and a cavity formed in the glass substrate. In various embodiments, the floor of the cavity is planar and substantially parallel to a plane defined by a top surface of the glass cladding layer. The glass cladding layer has a higher etch rate in an etchant than the glass core layer. In various embodiments, the wafer level encapsulated package is substantially optically transparent.

Disclosed herein is a method for forming a wafer level encapsulated package, the method comprising etching a cavity into a glass substrate and hermetically sealing the glass substrate to a wafer and encapsulating an electronic component within the cavity. The glass substrate includes a glass cladding layer fused to a glass core layer, and the glass cladding has a higher etch rate in an etchant than the glass core layer. In various embodiments, the cavity has a floor that is planar and substantially parallel to a plane defined by a top surface of the glass cladding layer. In some embodiments, a micro-electromechanical wafer level encapsulated device may be made according to the method.

Also disclosed herein is wafer level encapsulated package comprising a wafer, a glass substrate hermetically sealed to the wafer, and an electronic component. The glass substrate comprises a glass cladding layer fused to a glass core layer, a cavity formed in the glass substrate. The electronic component is encapsulated within the cavity. In various embodiments, the floor of the cavity is planar and substantially parallel to a plane defined by a top surface of the glass cladding layer. The glass cladding layer has a higher photosensitivity than the glass core layer. In various embodiments, the wafer level encapsulated package is substantially optically transparent.

Additionally, disclosed herein is a method for forming a wafer level encapsulated package, the method comprising photomachining a cavity into a glass substrate and hermetically sealing the glass substrate to a wafer and encapsulating an electronic component within the cavity. The glass substrate includes a glass cladding layer fused to a glass core layer, and the glass cladding has a higher photosensitivity than the glass core layer. In various embodiments, the cavity has a floor that is planar and substantially parallel to a plane defined by a top surface of the glass cladding layer. In some embodiments, a micro-electromechanical wafer level encapsulated device may be made according to the method.

Also disclosed herein is an electronic device comprising a singulated wafer, a glass substrate hermetically sealed to the singulated wafer, and an electronic component encapsulated within a cavity of the glass substrate. The glass substrate comprises a glass cladding layer fused to a glass core layer and a cavity formed in the glass substrate. The cavity has a floor that is planar and substantially parallel to a plane defined by a top surface of the glass cladding layer. The glass cladding layer has a higher etch rate in an etchant than the glass core layer, or the glass cladding layer has a higher photosensitivity than the glass core layer.

It is to be understood that both the foregoing general description and the following detailed description are merely exemplary, and are intended to provide an overview or framework to understanding the nature and character of the claimed subject matter. The accompanying drawings are included to provide a further understanding and are incorporated in and constitute a part of this specification. The drawings illustrate one or more embodiment(s), and together with the description, serve to explain principles and operation of the various embodiments.

DETAILED DESCRIPTION

Figure 1A:
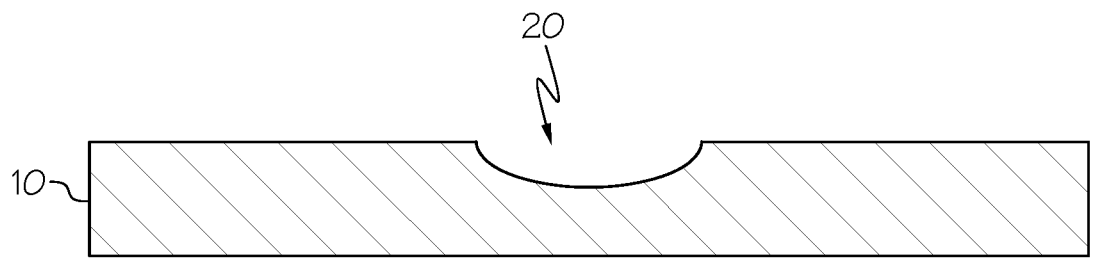
FIG. 1A is a cross-sectional schematic view of a glass substrate including a cavity formed according to the prior art.

Reference will now be made in detail to various embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments.

In various embodiments, a wafer level encapsulated package includes a wafer, a glass substrate, and an electronic component. In some embodiments, the glass substrate includes a glass cladding layer fused to a glass core layer, and the glass cladding layer has a higher etch rate in an etchant than the glass core layer. In some embodiments, the glass substrate includes a glass cladding layer fused to a glass core layer, and the glass cladding layer has a higher photosensitivity than the glass core layer. In various embodiments, a cavity is formed in the glass substrate. In some embodiments, the floor of the cavity is planar and substantially parallel to a plane defined by a top surface of the glass cladding layer. The glass substrate is hermetically sealed to the wafer such that the electronic component is encapsulated within the cavity.

In various embodiments, a method for forming a wafer level encapsulated package includes etching a cavity into a glass substrate and hermetically sealing the glass substrate to a wafer and encapsulating an electronic component within the cavity. In various embodiments, the glass substrate includes a glass cladding layer fused to a glass core layer. In some embodiments, the glass cladding has a higher etch rate in an etchant than the glass core layer. In embodiments, the cavity has a floor that is planar and substantially parallel to a plane defined by a top surface of the glass cladding layer.

In various embodiments, a method for forming a wafer level encapsulated package includes photomachining a cavity into a glass substrate and hermetically sealing the glass substrate to a wafer and encapsulating an electronic component within the cavity. In various embodiments, the glass substrate includes a glass cladding layer fused to a glass core layer. In some embodiments, the glass cladding has a higher photosensitivity than the glass core layer. In embodiments, at least a portion of the cavity floor is planar and substantially parallel to a plane defined by a top surface of the glass cladding layer.

In some embodiments, a wafer level encapsulated package includes a structured glass article as described herein. For example, the wafer level encapsulated package includes an electronic component (e.g., an integrated circuit chip) positioned in each of the one or more cavities of the structured glass article. Such a wafer level encapsulated package can benefit from the structured glass article as described herein. For example, such packages may offer advantages over polymers in packaging including but not limited to transparency, low RF loss factor, low electric and/or thermal conductivity, and/or improved ability to form hermetic seals. Additionally or alternatively, such packages may provide less optical distortion as compared to glass packages formed according to conventional techniques, as will be described in greater detail below.

Integrated circuit (IC) packaging is the back-end process of semiconductor device fabrication in which the block of semiconducting material is packaged in a supporting case that provides an electrical connection from the chip density to the printed circuit board density and prevents physical damage and corrosion of the semiconducting material. The case, also known as a "package," supports the electrical contacts which connect the device to a circuit board. This process is often referred to as packaging, but also can be referred to as semiconductor device assembly, encapsulation, or sealing.

Wafer-level packaging or wafer-level chip-scale packaging (WLP) is the technology of packaging an IC (e.g., chips or dies) while still part of the wafer, in contrast to the more conventional method of slicing the wafer into individual circuits (dicing) and then packaging them. WLP can enable integration of wafer fabrication, packaging, test, and burn-in at the wafer-level to streamline the manufacturing process undergone by a device from silicon start to customer shipment. WLP can include extending the wafer fabrication processes to include device interconnection and device protection processes. Most other kinds of packaging do wafer dicing first, and then put the individual die in a plastic package and attach the solder bumps. WLP involves attaching the top and bottom outer layers of packaging and the solder bumps to ICs while still in the wafer and then dicing the wafer.

One type of WLP is fan-in (FI), which has all the contact terminals within the footprint of the die. Such a configuration can pose a significant limitation when adjusting the layout of the contact terminals to match the design of the next-level substrate. Fan-out (FO) is another type of WLP that represents a compromise between die-level packaging and FI WLP. FO WLP involves dicing the semiconductor wafer and then embedding the singularized ICs in a reconstituted or artificial molded wafer. The dies are separated from each other on the reconstituted wafer by a distance that is big enough to allow the desired FO redistribution layer (RDL) to be manufactured using standard WLP processes. The FO WLP provides a way to connect the smaller die with fine lead pitch to the larger lead pitch of a printed circuit board.

Conventional techniques for forming wafer level packages include molding polymers (for example, compression molding filled epoxy) over the wafer, which may present challenges in forming hermetic seals. Additionally or alternatively, such packages may not be optically transparent. Although the use of glass structures in WLP has many advantages such as low cost, package size reduction, and fine lead pitch, conventional cavity formation techniques can produce concave cavities which may result in optical distortion. Various embodiments described herein enable the use of glass substrates for WLP while reducing or even eliminating optical distortion.

Figure 1B:
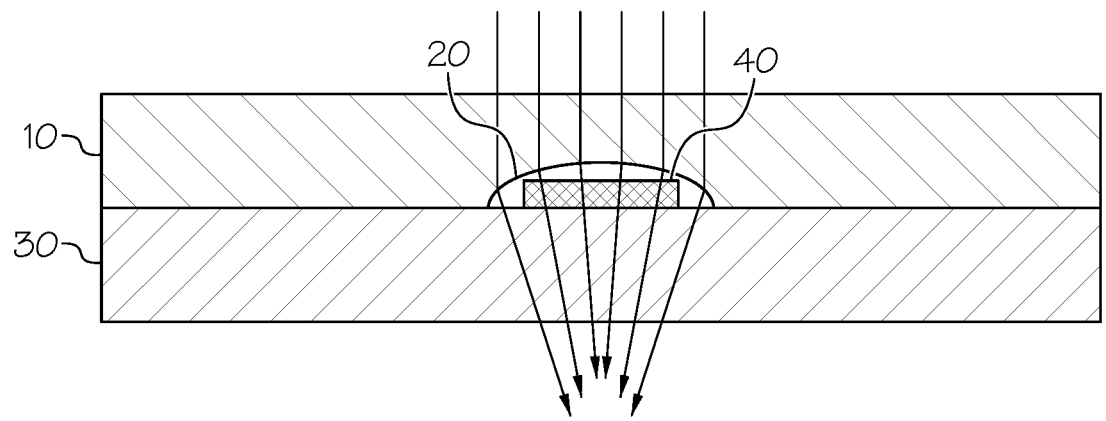
FIG. 1B is a cross-sectional schematic view of an electronic component encapsulated in a package according to the prior art.

FIG. 1A is a cross-sectional schematic view of a glass substrate 10 including a cavity 20 formed according to prior art techniques. In particular, the glass substrate 10 is a single layer of glass. As a result of wet etching, the cavity 20 has a concave shape which, as shown in FIG. 1B, can result in optical distortion when the glass substrate 10 is coupled to a wafer 30 having an electronic component 40 disposed thereon. In other words, as shown in FIG. 1B, light passing through the glass substrate 10 in the vicinity of the cavity 20 is diffracted and focused by the cavity 20. Accordingly, although some benefits of using glass, such as transparency, low RF loss factor, and/or low electric and/or thermal conductivity may be realized, the glass substrate 10 undesirably produces optical distortion because of the shape of the cavity 20.

Figure 2:
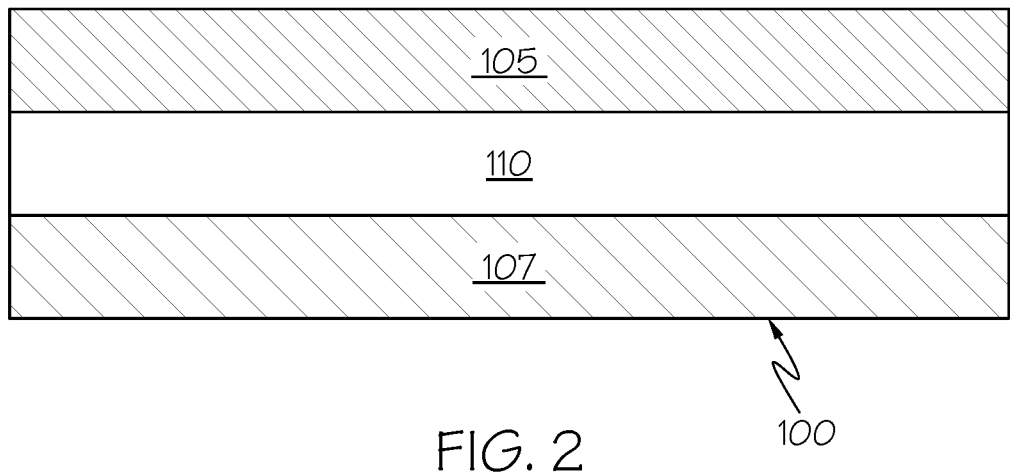
FIG. 2 is a cross-sectional schematic view of a glass substrate in accordance with one or more embodiments shown and described herein.

FIG. 2 is a cross-sectional schematic view of a glass substrate 100 according to various embodiments described herein. Glass substrate 100 includes a glass core layer 110 coupled to a first or upper glass cladding layer 105 and a second or lower glass cladding layer 107. The glass substrate 100 includes multiple glass layers and can be considered a glass laminate. In some embodiments, the layers 105, 107, 110 are fused together without any adhesives, polymer layers, coating layers or the like positioned between them. In other embodiments, the layers 105, 107, 110 are coupled (e.g., adhered) together using adhesives or the like.

Glass substrate 100 can have any suitable composition and be made using any suitable method. Examples of suitable glass compositions can include alkaline-earth aluminoborosilicate glasses, zinc borosilicate glasses, and soda-lime glass as well as glass ceramics, such as those enriched with magnesium oxide, yttria, beryllia, alumina, or zirconia. In general, glass substrate 100 and any of the layers 105, 107, 110 in the glass substrate can have any of the compositions or be made using any of the methods disclosed in U.S. Pat. No. 9,340,451 entitled "Machining of Fusion-Drawn Glass Laminate Structures Containing a Photomachinable Layer," issued May 17, 2016, and U.S. Patent Application Publication No. 2017/0073266 entitled "Glass Article and Method for Forming the Same," published Mar. 16, 2017, each of which is hereby incorporated by reference in its entirety.

The glass substrate 100 is configured so that at least one of the glass cladding layers 105, 107 and the glass core layer 110 have different physical dimensions and/or physical properties that allow for selective removal of the at least one glass cladding layer 105, 107 relative to the glass core layer 110 to form precisely dimensioned cavities 425, which can be sized and shaped to receive electronic components, receive an optically active object, and/or function as microfluidic channels.

One aspect of the glass substrate 100 that can vary widely is the thickness of the layers 105, 107, 110. For example, the layers 105, 107, 110 can all have the same thickness or different thicknesses or two of the layers can be the same thickness while the third layer has a different thickness. In some embodiments, one or both of the glass cladding layers 105, 107 may have a thickness that is the same or substantially the same as the thickness of an electronic component being packaged. Additionally, or alternatively, one or both of the glass cladding layers 105, 107 may have a thickness that is precisely sized for microfluidic flow.

In some embodiments, one or both of the glass cladding layers 105, 107 are approximately 70 microns to approximately 400 microns thick or approximately 100 microns to approximately 300 microns thick. In other embodiments, one or both of the glass cladding layers 105, 107 are at least approximately 70 microns thick or at least approximately 100 microns thick. In other embodiments, one or both of the glass cladding layers 105, 107 are no more than 400 microns thick or no more than 300 microns thick. These thicknesses generally correspond to the thickness of electronic components that commonly undergo FO WLP processing. It should be appreciated, however, that the glass cladding layers 105, 107 can have other thicknesses, particularly, when used with electronic components having smaller or larger thicknesses than those disclosed.

Another aspect of the glass substrate 100 that can vary widely is the glass composition of the layers 105, 107, 110. For example, the layers 105, 107, 110 can all have the same glass composition or different glass compositions or two of the layers can have the same glass composition while the third layer has a different glass composition. In general, one or both of the glass cladding layers 105, 107 have a glass composition that is different than the glass composition of the glass core layer 110. This provides the glass cladding layers 105, 107 certain properties that make them suitable to the formation of the cavities 425.

In some embodiments, the glass compositions of the layers 105, 107, 110 can vary such that the durability of the layers 105, 107, 110 in an etchant varies. For example, in embodiments, one or both of the glass cladding layers 105, 107 can have a dissolution rate in the etchant that is different than the glass core layer 110. The different durability between the layers 105, 107, 110 makes it possible to form the cavities 425 in the surface of the glass substrate 100. For example, the glass cladding layers 105, 107 can have a sufficiently high dissolution rate in the etchant that they can be etched to form the cavities 425. On the other hand, the glass core layer 110 can have a sufficiently low dissolution rate in the etchant that it is not substantially susceptible to being etched. Thus, the glass core layer 110 can act as an etch stop to limit the depth to which the glass substrate 100 can be etched using the etchant.

In some embodiments, one or both of the glass cladding layers 105, 107 have a dissolution rate in the etchant that is greater than the dissolution rate of the glass core layer 110. For example, the glass core layer 110 can have a dissolution rate in the etchant that is zero or sufficiently close to zero that it is not susceptible to being etched to any significant extent.

In some embodiments, the glass compositions of the layers 105, 107, 110 can vary such that the photosensitivity of the layers 105, 107, 110 varies. For example, in embodiments, one or both of the glass cladding layers 105, 107 can have a photosensitivity that is different than the glass core layer 110. The different photosensitivity between the layers 105, 107, 110 makes it possible to form the cavities 425 in the surface of the glass substrate 100. For example, the glass cladding layers 105, 107 can be sufficiently photosensitive that they can be photomachined to form the cavities 425. For example, exposure of the glass cladding layers 105, 107 to a radiation source can alter the properties of the glass cladding layer 105, 107. On the other hand, the glass core layer 110 can be sufficiently non-photosensitive that it is not susceptible to being photomachined. For example, the properties of the glass core layer 110 can be substantially unaffected by exposure to the radiation source.

In some embodiments, one or both of the glass cladding layers 105, 107 have a photosensitivity that is greater than the photosensitivity of the glass core layer 110. For example, the glass core layer 110 can have a photosensitivity that is zero or sufficiently close to zero that it is insusceptible to being photomachined to any significant extent.

It should be appreciated that numerous changes can be made to the embodiments of the glass substrate 100 shown in FIG. 2. For example, in some embodiments, the glass substrate 100 can include only two glass layers 105, 110. In other embodiments, the glass substrate 100 can include four or more glass layers. Numerous other variations are also contemplated.

In some embodiments, cavities 425 are formed in the glass substrate 100 to transform the glass substrate into a structured article as described herein. The cavities 425 can be formed in the surface of the glass substrate 100 using the method depicted in FIG. 3. In some embodiments, the method includes forming a mask 215 on a surface of the glass substrate 100. For example, the mask 215 is formed on the surface of the glass cladding layer 105 and/or the glass cladding layer 107. The mask 215 can be formed by printing (e.g., inkjet printing, gravure printing, screen printing, or another printing process) or another deposition process. In some embodiments, the mask 215 is resistant to the etchant (e.g., the etchant that will be used to etch the cavities 425 in the glass substrate 100). For example, the mask 215 can include an acrylic ester, a multifunctional acrylate n-vinyl-caprolactam, or another suitable mask material. In some embodiments, the mask 215 is formed from an ink material comprising a primer to enhance adhesion between the mask and the glass substrate 100. Such enhanced adhesion can reduce seepage of the etchant between the mask 215 and the glass substrate 100, which can help to enable the precise cavities described herein.

In some embodiments, the mask 215 includes one or more open regions at which the glass substrate 100 remains uncovered. The open regions of the mask 215 can have a pattern corresponding to the desired pattern of the cavities 245 to be formed in the glass substrate 100. For example, the pattern of the mask 215 can be an array of regularly repeating rectangular shapes (e.g., to receive electronic components as described herein). In such embodiments, the shapes patterned by the mask 215 can correspond closely to the shape of the electronic components. Other shapes also can be used, and the shapes can correspond closely to the shape of the electronic component or be capable of securely holding the electronic component in position on the glass substrate 100. Thus, the mask 215 can be configured as an etch mask to enable selective etching of the glass cladding layer 105 and/or the glass cladding layer 107 and form the cavities 425 in the glass substrate 100 as described herein.

Figure 3:
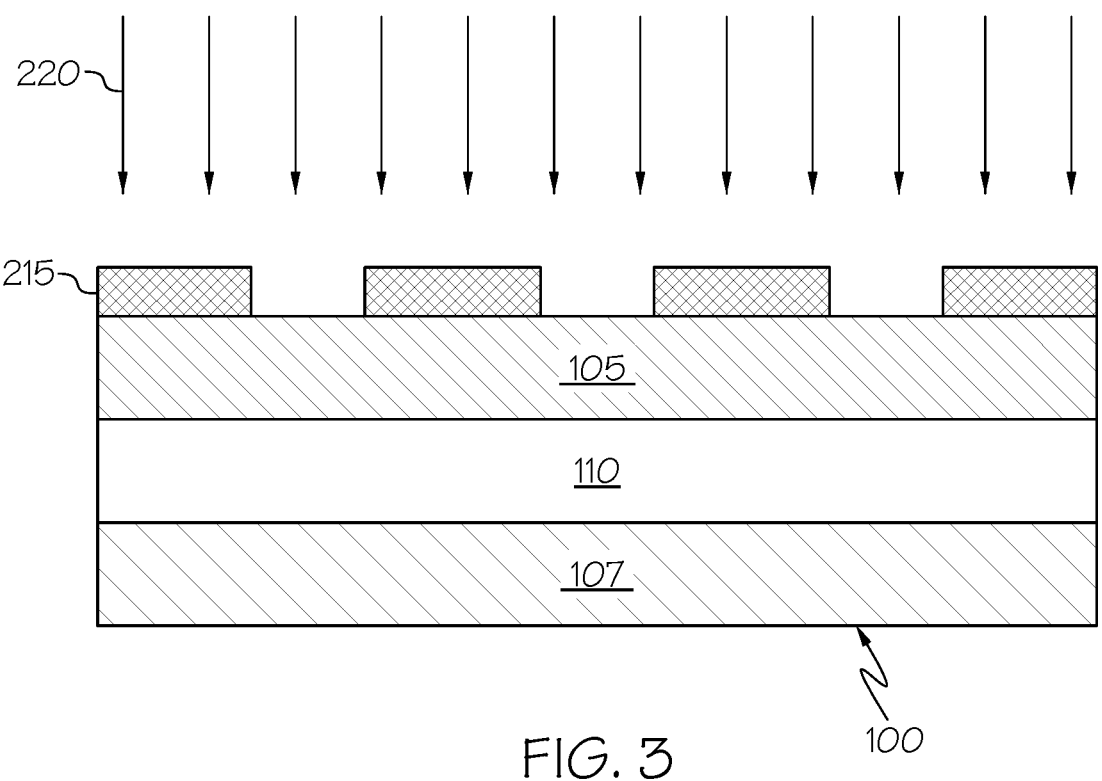
FIG. 3 is a cross-sectional schematic view of the glass substrate in FIG. 2 being selectively exposed to an etchant through a mask to form cavities in a cladding layer in accordance with one or more embodiments shown and described herein.

In some embodiments, the glass substrate 100 with the mask 215 disposed thereon is exposed to the etchant 220. For example, the glass cladding layer 105 and/or the glass cladding layer 107 is contacted with the etchant 220 as shown in FIG. 3, thereby selectively etching an exposed portion of the respective glass cladding layer that is uncovered by the mask 215 and forming the cavities 425 in the glass substrate, transforming the substrate into the shaped article. Thus, following forming the cavities 425, the glass substrate 100 can be referred to as the shaped article. In some embodiments, the glass substrate 100 with the mask 215 disposed thereon is exposed to the etchant 220 at an etching temperature and for an etching time. For example, the etching temperature is about 20° C., about 22° C., about 25° C., about 30° C., about 35° C., about 40° C., about 45° C., or about 50° C., or any ranges defined by any combination of the stated values. A lower etching temperature can help to maintain the integrity of the mask 215 during the etching, which can enable an increased etching time and/or improved cavity shape as described herein. Additionally, or alternatively, the etching time can be about 10 minutes, about 15 minutes, about 20 minutes, about 25 minutes, about 30 minutes, about 35 minutes, about 40 minutes, about 45 minutes, about 50 minutes, about 55 minutes, about 60 minutes, about 65 minutes, about 70 minutes, about 75 minutes, about 80 minutes, about 85 minutes, or about 90 minutes, or any ranges defined by any combination of the stated values. A relatively long etching time (e.g., an etching time of greater than 10 minutes) can enable substantially vertical sidewalls of the cavities 425 as described herein.

In some embodiments, the glass cladding layer 105 and/or the glass cladding layer 107 etch at least 1.5 times faster, at least 2 times faster, at least 5 times faster, at least 10 times faster, at least 20 times faster, or at least 100 times faster than the glass core layer 110. Additionally, or alternatively, a ratio of the etch rate of the glass cladding layer 105 and/or the glass cladding layer 107 to the etch rate of the glass core layer 110 is about 5, about 10, about 15, about 20, about 25, about 30, about 35, about 40, about 45, about 50, about 55, about 60, about 65, about 70, about 75, about 80, about 85, about 90, about 95, about 100, or any ranges defined by any combination of the stated values.

Figure 4A:
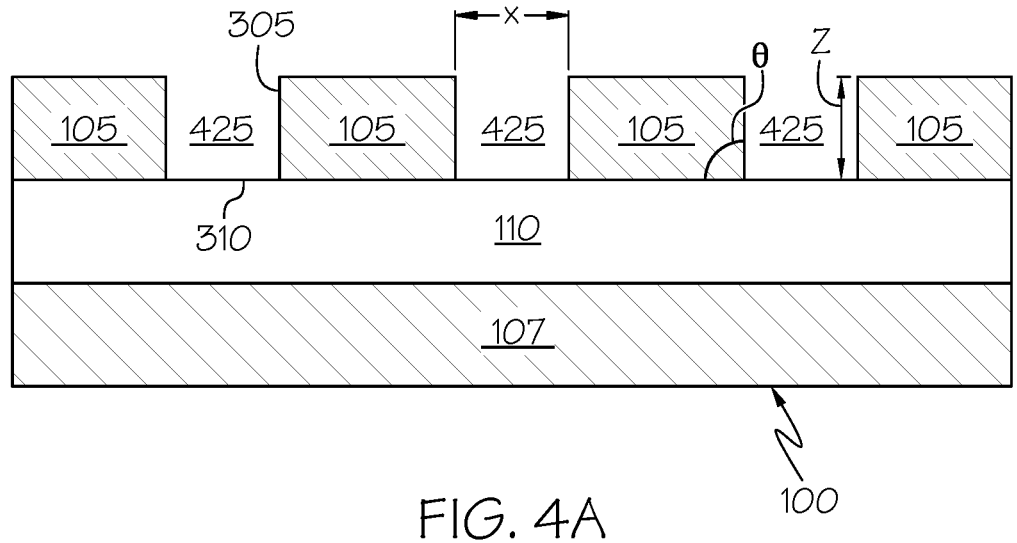
FIG. 4A is a cross-sectional schematic view of the glass substrate in FIGS. 2-3 after forming cavities therein and removing the mask in accordance with one or more embodiments shown and described herein.

In some embodiments, forming the cavities 425 includes etching substantially entirely through the glass cladding layer 105 and/or the glass cladding layer 107 to expose a portion of the glass core layer 110 at the bottom of the cavities, as shown in FIG. 4A. Thus, the sidewalls 305 of the cavities 425 are defined by the glass cladding layer 105 and/or the glass cladding layer 107, and the floors 310 of the cavities are defined by the glass core layer 110. In some embodiments, the glass core layer 110 is not substantially etched during formation of the cavities 425. Thus, the glass core layer 110 serves as an etch stop that determines the depth of the cavities 425. In other words, in some embodiments, the cavities 425 extend through the glass cladding layer 105 and/or the glass cladding layer 107 to the glass core layer 110.

In some embodiments, the floor 310 of each of the cavities 425 is of optical quality. For example, a surface roughness (Ra) of the floor 310 of each of the cavities 425 is at most about 50 nm, at most about 40 nm, at most about 30 nm, at most about 20 nm, at most about 10 nm, at most about 9 nm, at most about 8 nm, at most about 7 nm, at most about 6 nm, or at most about 5 nm. Such low surface roughness can be enabled by the etch stop provided by the glass core layer 110 and/or agitating the etchant during the etching to remove etching byproducts from each of the cavities 425. Additionally, or alternatively, such low surface roughness can enable light to pass through the floor 310 (e.g., for optical activation and/or analysis of an object or material disposed within the cavities) without substantial distortion.

In some embodiments, the floor 310 of each of the cavities 425 is substantially flat. In other words, the floor 310 of each of the cavities 425 is planar and substantially parallel to a plane defined by a top surface of the glass cladding layer 105. In various embodiments, the plane of the floor 310 has an area that is at least 75%, at least 80%, at least 85%, at least 90%, at least 95%, or at least 98% of an area of a plane defined by the perimeter the cavity 425 at the top surface of the glass cladding layer 105. For example, a difference between a first depth of the cavity 425 at a first position along the perimeter of the cavity 425 and a second depth of the cavity 425 at a second position along the perimeter of the cavity 425 opposite the first position (e.g., diametrically opposed) is at most about 5 µm, at most about 4 µm, at most about 3 µm, at most about 2 µm, at most about 1 µm, at most about 0.9 µm, at most about 0.8 µm, at most about 0.7 µm, at most about 0.6 µm, at most about 0.5 µm, at most about 0.4 µm, at most about 0.3 µm, at most about 0.2 µm, or at most about 0.1 µm. Such a low depth difference can be enabled by the etch stop provided by the glass core layer 110. For example, the depth of the cavity 425 can be determined primarily by the thickness t of the glass cladding layer 105 and/or the glass cladding layer 107 without changing substantially as a result of changes in etch temperature and/or etch time.

In some embodiments, the sidewalls 305 of the cavities 425 are substantially vertical. For example, an angle θ formed between the sidewall 305 and the floor 310 of the cavity 425 measured within the glass cladding is approximately 90°, or from about 85° to about 91°. However, in embodiments, the angle θ formed between the sidewall 305 and the floor 310 of the cavity 425 measured within the glass cladding (shown in FIG. 4A) is from about 60° to about 90°. In some of such embodiments, the depth of the cavity is at least about 30 µm, at least about 40 µm, at least about 50 µm, at least about 60 µm, at least about 70 µm, at least about 80 µm, or at least about 90 µm. For example, the depth of the cavity can be from about 30 µm to about 210 µm, from about 40 µm to about 200 µm, from about 50 µm to about 150 µm. Such a low angle of the sidewalls can be enabled by an increased etching time, which can be enabled by the etch stop provided by the glass core layer 110. For example, the etching time can be extended to remove material at the intersection between the sidewalls and the floor near the bottom of the cavity without substantially increasing the depth of the cavity. Removing such material can result in a straighter (e.g., vertical) sidewall compared to conventional wet etching processes.

Figure 8:
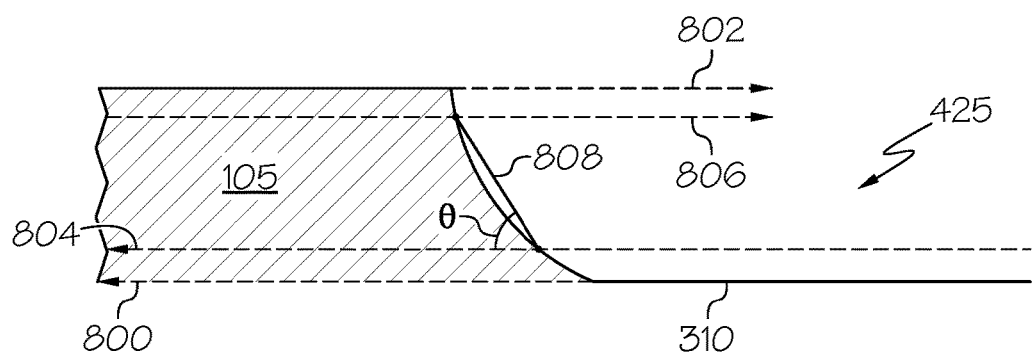
FIG. 8 is a cross-sectional schematic view illustrating a method of calculating a wall angle in accordance with one or more embodiments shown and described herein.

For the purposes of calculating a wall angle θ described herein, it is contemplated that in some embodiments, the wall may have a slight curvature. Accordingly, a measurement of the wall angle θ may be obtained according to a method illustrated in FIG. 8. In particular, line 800 is drawn along the floor 310 and line 802 is drawn along the top surface of the glass cladding layer 105. An additional line 804 is drawn at a 1% depth above and parallel to line 800 and an additional line 806 is drawn at a 1% depth below and parallel to line 802. A straight line 808 is then drawn between the points where lines 804 and 806 intersect the glass cladding layer 105, as shown in FIG. 8. The wall angle θ is the angle between line 806 and line 804 as measured within the glass cladding, as shown in FIG. 8.

Figure 4B:
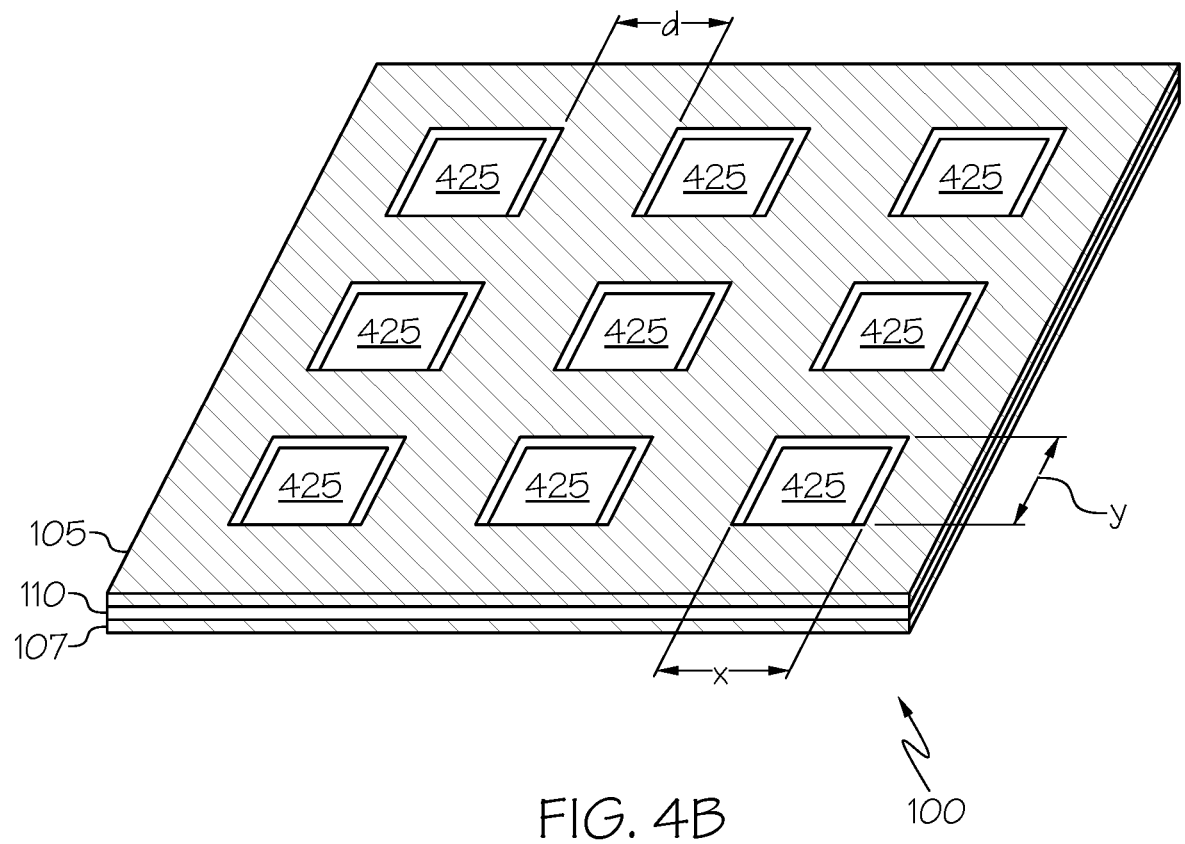
FIG. 4B is a perspective view of the glass substrate in FIGS. 2-3 after forming cavities therein and removing the mask in accordance with one or more embodiments shown and described herein.

In some embodiments, following formation of the cavities 425, the mask 215 is removed from the glass substrate 100. For example, removing the mask 215 includes contacting the mask with a solvent, thereby removing the mask from the surface of the glass substrate. In some embodiments, the solvent is water. For example, removing the mask 215 may include submerging the glass substrate 100 with the mask 215 disposed thereon into water, thereby removing the mask from the surface of the glass substrate. FIGS. 4A and 4B are cross-sectional schematic and perspective views, respectively, of the glass substrate 100 with the cavities 425 formed therein and the mask 215 removed therefrom. Additional details on the formation of cavities 425 within the glass substrate 100 may be found in Patent Application No. 62/582,297, filed Nov. 6, 2017, and entitled "Precision Structured Glass Articles, Integrated Circuit Packages, Optical Devices, Microfluidic Devices, and Methods for Making the Same," which is incorporated by reference herein in its entirety.

Although embodiments are described herein with reference to using an etching process to form the cavities 425 in the glass substrate 100, it is contemplated that in some embodiments, the cavities 425 may be formed in the glass substrate 100 by a photomachining process. For example, a photomask may be applied to the surface of the glass cladding layer 105. The glass cladding layer 105 may then be exposed to a source of radiation through the photomask to pattern the cavities 425. Any suitable source of radiation can be used in the photomachining process, provided that it is capable of altering the properties of the glass cladding layer 105. For example, the source of radiation can be a UV lamp. In various embodiments, the glass cladding layer 105 is sufficiently photosensitive that the radiation changes its crystallinity properties, forming crystallized regions that are capable of being selectively removed by a physical and/or chemical procedure such as selective etching (e.g., wet etching). Details on such a process may be found in Patent Application No. 62/536,103, filed Jul. 24, 2017, and entitled "Reconstituted Wafer- and/or Panel-Level Packages and Methods for Making the Same," which is incorporated by reference herein in its entirety.

The cavities 425 shown in FIGS. 4A and 4B have a rectangular shape (as can be seen in FIG. 4B) that corresponds to the shape of the electronic components 610. It should be appreciated, however, that the cavities 425 can have any suitable shape, and can vary depending on the particular electronic component to be fixed therein. For example, the cavities 425 can have a square shape, a circular shape, or any other polygonal or non-polygonal shape as viewed from the top surface of the glass cladding layer 105.

Figure 5:
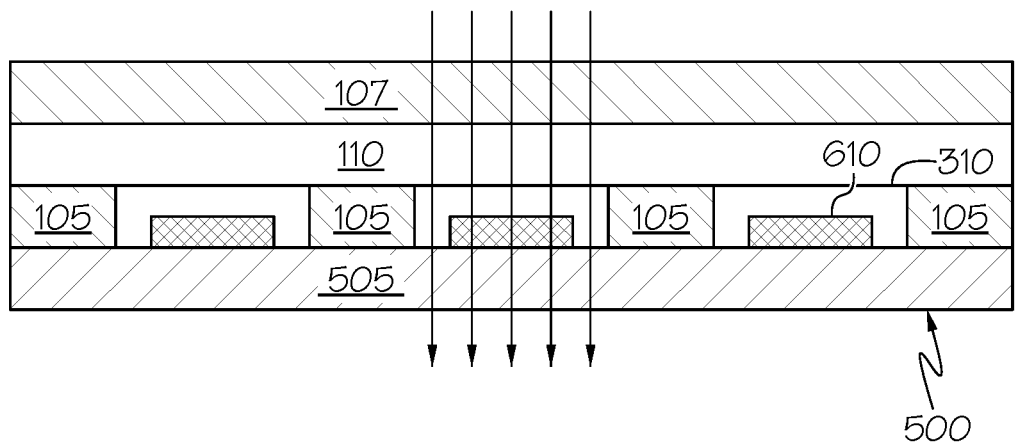
FIG. 5 is a cross-sectional schematic view of an embodiment of a wafer- and/or panel-level package with electronic components hermetically sealed between the glass substrate and a wafer in accordance with one or more embodiments shown and described herein.

Turning now to FIG. 5, in various embodiments, the shaped article is used as an integrated circuit package, and in particular, as a wafer level package. For example, electronic components 610 are hermetically sealed within the cavities 425 to form a wafer- and/or panel-level package 500, as shown in FIG. 5. The electronic components 610 can be, for example, disposed on a wafer 505, or can be positioned within the cavities 425 independently of the wafer 505, such as by using a pick and place. In still other embodiments, the electronic component 610 can be bound to a handle wafer that is fused to the glass to hermetically seal the cavity and encapsulate the electronic component 610. The cavities 425 can be configured to receive any suitable electronic components 610. In some embodiments, the electronic components 610 are silicon based IC chips, antennas, sensors, or the like. More particularly, by way of example and not limitation, the electronic component may be a MEMS sensor, a MEMS mirror, a quantum dot, an image sensor, a diode, a laser transmitter, a receiver, a transceiver, or an LED.

As depicted in FIG. 5, the rectangular shape of the cavities 425, and specifically the flat floor 310, reduce or even eliminate optical distortion of light passing through the wafer- and/or panel-level package 500. In other words, in contrast to the glass substrate of FIG. 1, light passing through the substrate depicted in FIG. 5 in the vicinity of the cavity 425 remains parallel and is not focused by the cavity 425.

In various embodiments, the wafer 505 is a silicon wafer, although other types of substrates are contemplated and can vary depending on the particular embodiment. For example, the wafer 505 may be made from silicon, glass, transparent ceramics, gallium arsenide, and/or other compound III-V or II-VI materials typically used in the manufacturing of electronics (e.g., boron nitride, boron phosphide, boron arsenide, aluminum nitride, aluminum phosphide, gallium arsenide, indium antimonide, cadmium selenide, cadmium sulfide, zinc oxide, zinc telluride, etc.).

In some embodiments, one or more coatings may be disposed within the cavities 425 to embed additional functionality. For example, optical apertures, optical coatings, barrier coatings, passive components, and/or getter materials may be disposed within the cavities 425 prior to hermetically sealing the glass substrate to the wafer 505. For example, in packages to be used with optical MEMS or top emitting/receiving photonic components, apertures and/or filters may be integrated within the cavities 425.

Figure 6:
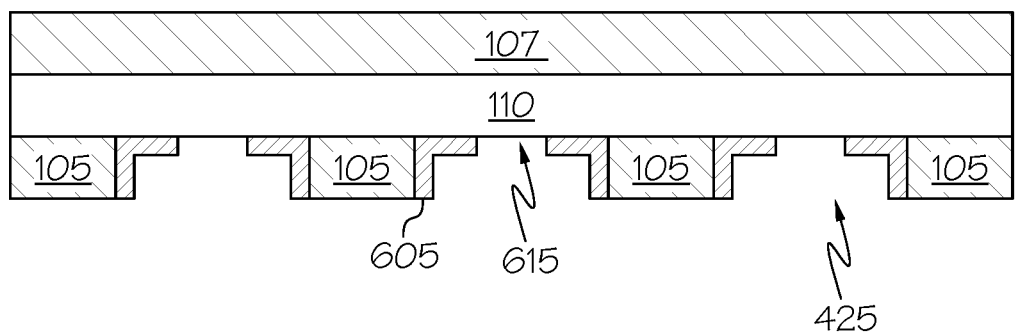
FIG. 6 is a cross-sectional schematic view of an embodiment of a glass substrate including optical apertures formed within the cavities in accordance with one or more embodiments shown and described herein.

FIG. 6 is a cross-sectional perspective view of a glass substrate having optical apertures 615 formed within the cavities 425. In particular, after the cavities 425 are formed, an anti-reflective (AR) coating 605, such as a dark mirror, may be deposited on the sidewalls 305 and floor 310 of each cavity 425. The AR coating 605 may be deposited using any suitable method, such as chemical vapor deposition (CVD), physical vapor deposition (PVD), or sputtering. After the AR coating 605 is deposited, a portion of the AR coating 605 may be removed from the floor 310 of the cavity 425 to form the optical aperture 615. The AR coating 605 may be removed using any suitable method, such as etching. Alternatively, a mask may be used during deposition of the AR coating 605 to prevent the AR coating 605 from being deposited along a portion of the floor 310, thereby forming the aperture.

Although deposition of an AR coating 605 is described, it is contemplated that other types of coatings, such as barrier coatings, other types of optical coatings, coatings forming passive components, and the like, may be formed or deposited within the cavities 425. The use of the glass substrate according to various embodiments herein may enable such coatings and other functionalities to be incorporated into the wafer level package in a substantially parallel way during manufacture of the WLP. Such techniques may enable rapid formation of an array of structures in a highly repeatable manner.

In various embodiments, the cavities 425 are each substantially the same size (width (x), length (y), and/or depth (z)) as the electronic components 610 to allow an exact fit of an electronic component 610 in each corresponding cavity 425. Nevertheless, there may be situations where the electronic components 610 may not be perfectly sized within the cavities 425. In embodiments in which the electronic component 610 is smaller in size than the cavity 425, the cavity may be filled around the electronic component 610, such as with a polymer, or may be left unfilled, depending on the particular embodiment.

The electronic components 610 can generally vary 1-2 microns in size. In some embodiments, the width (x), length (y), and/or depth (z) of each cavity 425 (shown in FIGS. 4A and 4B) including any coatings or other components disposed therein varies by no more than 20 microns, no more than 10 microns, no more than 5 microns, or no more than 4 microns relative to: (a) a target size of the dimension(s) of the cavities 425 including any coatings or other components disposed therein, (b) the actual size of the corresponding dimension(s) of the electronic component 610, and/or (c) the target size of the corresponding dimension(s) of the electronic components 610. For example, the width (x), length (y), and/or depth (z) of each cavity 425 including any coatings or other components disposed therein can be no more than 20 microns larger, no more than 10 microns larger, no more than 5 microns larger, or no more than 4 microns larger than: (a) a target size of the dimension(s) of the cavities 425 including any coatings or other components disposed therein, (b) the actual size of the corresponding dimension(s) of the electronic component 610, and/or (c) the target size of the corresponding dimension(s) of the electronic components 610. The laminate structure of the glass substrate 100 can provide particularly precise control of the depth of the cavities 425 compared to conventional substrates.

In some embodiments, the cavity has a width of from about 2 mm to about 10 mm. For example, the cavity may have a width (x) of about 2 mm, about 3 mm, about 5 mm, about 8 mm, or about 10 mm. In some embodiments, a distance between the cavity and an adjacent cavity may be from about 1 mm to about 3 mm. The distance d between the cavity and an adjacent cavity may be measured, for example, from the sidewall of the cavity to the sidewall of the adjacent cavity, as shown in FIG. 4B.

Figure 7:
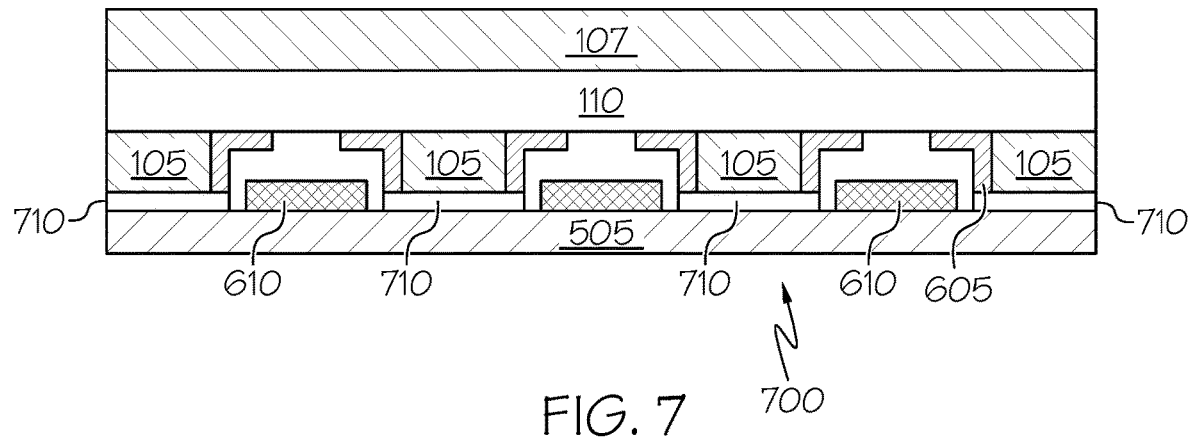
FIG. 7 is a cross-sectional schematic view of an embodiment of a wafer- and/or panel-level package having optical apertures formed within the cavities in accordance with one or more embodiments shown and described herein.

FIG. 7 is a cross-sectional schematic view of an embodiment of a wafer- and/or panel-level package 700 in which the glass substrate of FIG. 6 is hermetically sealed to a wafer 505. In the embodiment depicted in FIG. 7, the glass substrate, and specifically the glass cladding layer 105 is bonded to the wafer 505 through a bonding layer 710. In the embodiment depicted in FIG. 7, the bonding layer 710 is an Au—In layer, although other bonding layers are contemplated. In other words, the bonding layer 710 may depend on the particular sealing method employed, and may further depend on the material used to form the wafer 505. For example, in some embodiments, the glass substrate may be bonded to the wafer 505 by laser welding, Van der Waals bonding (with or without plasma activation) and thermal treatment, metal-metal joining methods, including but not limited to, Au-eutectic bonding or Au—In bonding, frit bonding, or other suitable techniques known and use by those in the art. It is further contemplated that in some embodiments, the hermetic sealing of the glass substrate and the wafer can be achieved without the use of a bonding layer 710.

In embodiments in which the bonding layer 710 is an Au—In layer, an Au—In alloy may be deposited on either or both of the surface of the glass cladding layer 105 and the surface of the wafer 505 using sputtering techniques and the surfaces are placed in contact with one another. The package is heated to a temperature suitable to melt the bonding layer 710, thereby fusing the glass substrate to the wafer 505 and hermetically sealing the cavities 425. Similar techniques may be employed using other metals or materials, depending on the particular embodiment.

In some embodiments, the wafer- and/or panel-level package is singularized to produce separate packaged units, referred to herein as electronic devices. For example, each electronic device includes one of the electronic components encapsulated within a cavity of the glass substrate by the hermetic sealing of the glass substrate to the singulated wafer. As used herein, the term "singulated wafer" refers to the wafer after separation into separate electronic devices. Separation may be performed by dicing (e.g., mechanical and/or laser dicing) or any other suitable separation technique.

In various embodiments, a wafer- and/or panel-level package is described as comprising a glass substrate comprising a plurality of cavities and an electronic component positioned in each one of the plurality of cavities in the glass substrate. It should be noted that such a wafer- and/or panel-level package may have additional cavities with or without electronic components positioned therein. For example, in some embodiments, a wafer- and/or panel-level package includes a plurality of cavities with a electronic component positioned in each one of the plurality of cavities and one or more additional cavities that are free of an electronic component positioned therein. In other embodiments, a wafer- and/or panel-level package includes a plurality of cavities with an electronic component positioned in each one of the plurality of cavities and is free of additional cavities.

Various embodiments described herein include a wafer- and/or panel-level package that may be used to form micro-electromechanical wafer level encapsulated devices (MEMS devices), photonics devices, semiconductor devices, and the like. The wafer- and/or panel-level package and resulting device may exhibit low RF loss factor, low electric and/or thermal conductivity, and/or hermetic sealing, thereby providing advantages over conventional packaging. Various embodiments may further advantageously provide higher wafer utilization, less optical distortion, and/or improve manufacturing efficiencies by enabling wafer-level semiconductor processing to be used to manufacture and embed functionalities into the packaging.

Terminology and Interpretative Norms

The term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

The terms "glass" and "glass composition" encompass both glass materials and glass-ceramic materials, as both classes of materials are commonly understood. Likewise, the term "glass structure" encompasses structures comprising glass. The term "wafer- and/or panel-level package" encompasses any size of substrate package including wafer level packages and panel level packages.

Numerical values, including endpoints of ranges, can be expressed herein as approximations preceded by the term "about," "approximately," or the like. In such cases, other embodiments include the particular numerical values. Regardless of whether a numerical value is expressed as an approximation, two embodiments are included in this disclosure: one expressed as an approximation, and another not expressed as an approximation. It will be further understood that an endpoint of each range is significant both in relation to another endpoint, and independently of another endpoint.

The term "surface roughness" means Ra surface roughness determined as described in ISO 25178, Geometric Product Specifications (GPS)—Surface texture: areal, filtered at 25 μm unless otherwise indicated. The surface roughness values reported herein were obtained using a Keyence confocal microscope.

The term "formed from" can mean one or more of comprises, consists essentially of, or consists of. For example, a component that is formed from a particular material can comprise the particular material, consist essentially of the particular material, or consist of the particular material.

Directional terms as used herein—for example up, down, right, left, front, back, top, bottom, vertical, horizontal—are made only with reference to the figures as drawn and are not intended to imply absolute orientation unless otherwise expressly stated.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

Unless otherwise indicated, all numbers or expressions, such as those expressing dimensions, physical characteristics, and the like, used in the specification (other than the claims) are understood to be modified in all instances by the term "approximately." At the very least, and not as an attempt to limit the application of the doctrine of equivalents to the claims, each numerical parameter recited in the specification or claims which is modified by the term "approximately" should be construed in light of the number of recited significant digits and by applying ordinary rounding techniques.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

All disclosed numerical values are to be understood as being variable from 0-100% in either direction and thus provide support for claims that recite such values or any and all ranges or subranges that can be formed by such values. For example, a stated numerical value of 8 should be understood to vary from 0 to 16 (100% in either direction) and provide support for claims that recite the range itself (e.g., 0 to 16), any subrange within the range (e.g., 2 to 12.5) or any individual value within that range (e.g., 15.2).

The drawings shall be interpreted as illustrating one or more embodiments that are drawn to scale and/or one or more embodiments that are not drawn to scale. This means the drawings can be interpreted, for example, as showing: (a) everything drawn to scale, (b) nothing drawn to scale, or (c) one or more features drawn to scale and one or more features not drawn to scale. Accordingly, the drawings can serve to provide support to recite the sizes, proportions, and/or other dimensions of any of the illustrated features either alone or relative to each other. Furthermore, all such sizes, proportions, and/or other dimensions are to be understood as being variable from 0-100% in either direction and thus provide support for claims that recite such values or any and all ranges or subranges that can be formed by such values.

The terms recited in the claims should be given their ordinary and customary meaning as determined by reference to relevant entries in widely used general dictionaries and/or relevant technical dictionaries, commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used in a manner that is more expansive than its ordinary and customary meaning, the term should be given its ordinary and customary meaning plus the additional expansive meaning, or (b) if a term has been explicitly defined to have a different meaning by reciting the term followed by the phrase "as used in this document shall mean" or similar language (e.g., "this term means," "this term is defined as," "for the purposes of this disclosure this term shall mean," etc.). References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

The subject matter recited in the claims is not coextensive with and should not be interpreted to be coextensive with any embodiment, feature, or combination of features described or illustrated in this document. This is true even if only a single embodiment of the feature or combination of features is illustrated and described in this document.

It will be apparent to those skilled in the art that various modifications and variations can be made without departing from the spirit or scope of the claimed subject matter. Accordingly, the claimed subject matter is not to be restricted except in light of the attached claims and their equivalents.

What is claimed is:

1. A wafer level encapsulated package comprising:
a wafer;
a glass substrate that is transparent and hermetically sealed to the wafer, the glass substrate comprising a glass cladding layer fused to a glass core layer, the glass substrate comprising a cavity, wherein a floor of the cavity is planar and substantially parallel to a plane defined by a top surface of the glass cladding layer, and wherein the glass cladding layer has a higher etch rate in an etchant than the glass core layer; and
an electronic component encapsulated within the cavity;
wherein the cavity comprises at least one side wall defined by the glass cladding layer that is substantially perpendicular to the floor of the cavity defined by the glass core layer.

2. The wafer level encapsulated package of claim 1, wherein the cavity extends through the glass cladding layer to the glass core layer of the glass substrate.

3. The wafer level encapsulated package of claim 1, wherein the electronic component is selected from a group consisting of a MEMS sensor, a MEMS mirror, a quantum dot, an image sensor, a diode, a laser transmitter, a receiver, a transceiver, and an LED.

4. The wafer level encapsulated package of claim 1, wherein the cavity has a width of from 2 to 10 mm.

5. The wafer level encapsulated package of claim 1, wherein a distance between the cavity and an adjacent cavity is from 1 to 3 mm.

6. The wafer level encapsulated package of claim 1, wherein a depth of the cavity is from 500 to 300 µm.

7. The wafer level encapsulated package of claim 1, wherein the wafer comprises a silicon wafer, a glass substrate, or a transparent ceramic wafer substrate.

8. The wafer level encapsulated package of claim 1, further comprising an optical aperture, an optical coating, a barrier coating, a passive component, or a getter material disposed within the cavity.

9. The wafer level encapsulated package of claim 1, wherein the wafer is substantially optically transparent.

10. A method for forming the wafer level encapsulated package of claim 1, the method comprising:
etching the cavity into the glass substrate; and
hermetically sealing the glass substrate to the wafer and encapsulating the electronic component within the cavity.

11. The wafer level encapsulated package of claim 1, wherein a distance between the cavity and an adjacent cavity is from 1 to 3 mm.

12. The wafer level encapsulated package of claim 1, wherein a depth of the cavity is from 500 to 300 µm.

13. The wafer level encapsulated package of claim 1, wherein the floor of the cavity has a surface roughness of at most 50 nm.

14. A wafer level encapsulated package comprising:
a wafer;
a glass substrate that is transparent and hermetically sealed to the wafer, the glass substrate comprising a glass cladding layer fused to a glass core layer, the glass substrate comprising a cavity, wherein a floor of the cavity is planar and substantially parallel to a plane defined by a top surface of the glass cladding layer, and wherein the glass cladding layer has a higher photosensitivity than the glass core layer; and
an electronic component encapsulated within the cavity;
wherein the cavity comprises at least one side wall defined by the glass cladding layer that is substantially perpendicular to the floor of the cavity defined by the glass core layer.

15. The wafer level encapsulated package of claim 14, wherein the cavity extends through the glass cladding layer to the glass core layer of the glass substrate.

16. The wafer level encapsulated package of claim 14, wherein the electronic component is selected from a group consisting of a MEMS sensor, a MEMS mirror, a quantum dot, an image sensor, a diode, a laser transmitter, a receiver, a transceiver, and an LED.

17. The wafer level encapsulated package of claim 14, wherein the cavity has a width of from 2 to 10 mm.

18. The wafer level encapsulated package of claim 14, wherein the wafer comprises a silicon wafer, a glass substrate, or a transparent ceramic wafer substrate.

19. The wafer level encapsulated package of claim 14, further comprising an optical aperture, an optical coating, a barrier coating, a passive component, or a getter material disposed within the cavity.

20. The wafer level encapsulated package of claim 14, wherein the wafer is substantially optically transparent.

21. A method for forming the wafer level encapsulated package of claim 14, the method comprising:
   photomachining the cavity into the glass substrate; and
   hermetically sealing the glass substrate to the wafer and encapsulating the electronic component within the cavity.

22. An electronic device comprising:
   a substrate singulated from a wafer;
   a glass substrate that is transparent and hermetically sealed to the substrate, the glass substrate comprising a glass cladding layer fused to a glass core layer, the glass substrate comprising a cavity, wherein a floor of the cavity is planar and substantially parallel to a plane defined by a top surface of the glass cladding layer; and
   an electronic component encapsulated within the cavity;
   wherein the glass cladding layer has a higher etch rate in an etchant than the glass core layer, or the glass cladding layer has a higher photosensitivity than the glass core layer; and
   wherein the cavity comprises at least one side wall defined by the glass cladding layer that is substantially perpendicular to the floor of the cavity defined by the glass core layer.

23. The electronic device of claim 22, further comprising an optical aperture, an optical coating, a barrier coating, a passive component, or a getter material disposed within the cavity.

* * * * *